United States Patent
Goux et al.

(10) Patent No.: US 7,728,319 B2
(45) Date of Patent: Jun. 1, 2010

(54) VERTICAL PHASE CHANGE MEMORY CELL AND METHODS FOR MANUFACTURING THEREOF

(75) Inventors: Ludovic Raymond Andre Goux, Hannut (BE); Dirk Johan Cecil Christiaan Marie Wouters, Heverlee (BE); Judit Gloria Lisoni Reyes, Oud-Heverlee (BE); Thomas Gille, Leuven (BE)

(73) Assignee: NXP B.V., Eindhoven (NL)

( * ) Notice: Subject to any disclaimer, the term of this patent is extended or adjusted under 35 U.S.C. 154(b) by 48 days.

(21) Appl. No.: 12/158,113

(22) PCT Filed: Dec. 12, 2006

(86) PCT No.: PCT/IB2006/054785

§ 371 (c)(1),
(2), (4) Date: Jun. 19, 2008

(87) PCT Pub. No.: WO2007/072308

PCT Pub. Date: Jun. 28, 2007

(65) Prior Publication Data

US 2008/0303014 A1      Dec. 11, 2008

Related U.S. Application Data

(60) Provisional application No. 60/752,739, filed on Dec. 20, 2005.

(51) Int. Cl.
*H01L 47/00*     (2006.01)
(52) U.S. Cl. .................. 257/3; 257/4; 257/5; 257/750; 257/E21.021; 438/95; 438/637; 365/148

(58) Field of Classification Search .................. 257/1–8, 257/200, 209, 211, 326, 381, 750–766, E21.021, 257/E21.421; 365/148; 438/95, 637
See application file for complete search history.

(56) References Cited

U.S. PATENT DOCUMENTS

| 5,406,509 A | 4/1995 | Ovshinsky et al. |
| 5,789,758 A | 8/1998 | Reinberg |
| 2005/0029502 A1* | 2/2005 | Hudgens ..................... 257/4 |

(Continued)

FOREIGN PATENT DOCUMENTS

FR      2861887 A1      5/2005

(Continued)

OTHER PUBLICATIONS

Pirovano, A; et al "Low-Field Amorphous State Resistance and Threshold Voltage Drift in Chalcogenide Material" IEEE Transactions on Electronic Devices, vol. 51, No. 5, May 2004, pp. 714-719.

(Continued)

*Primary Examiner*—Evan Pert
*Assistant Examiner*—Scott R Wilson

(57) ABSTRACT

The present invention discloses a vertical phase-change-memory (PCM) cell, comprising a stack of a bottom electrode (5) contacting a first layer of phase change material (14), a dielectric layer (12) having an opening (13), a second layer of phase change material (6) in contact with the first layer of phase change material through the opening in the dielectric layer and a top electrode (7) contacting this second layer of phase change material.

20 Claims, 7 Drawing Sheets

U.S. PATENT DOCUMENTS

| | | | |
|---|---|---|---|
| 2005/0110983 | A1 | 5/2005 | Jeong et al. |
| 2005/0212037 | A1 | 9/2005 | Pinnow et al. |
| 2006/0113520 | A1* | 6/2006 | Yamamoto et al. ............. 257/3 |
| 2007/0072125 | A1* | 3/2007 | Sousa et al. ............ 430/270.13 |

FOREIGN PATENT DOCUMENTS

| | | | |
|---|---|---|---|
| WO | WO 2005045847 A1 * | 5/2005 | |

OTHER PUBLICATIONS

Lai, Stefan; et al "OUM—A 180NM Nonvolatile Memory Cell Element Technology for Stand Alone and Embedded Applications" IEEE International Electron Devices Meeting, 2001. IEDM 2001 Technical Digest, Dec. 2001, pp. 36.5.1-36.5.4.

Jeong, C. W; et al "Switching Current Scaling and Reliability Evaluation in PRAM" Proceedings of the Non-Volatile Semiconductor Memory Workshop, 2004, pp. 28-29.

Cho, S. L; et al "Highly Scalable On-Axis Confined Cell Structure for High Density PRAM Beyond 256 MB" Proceedings of the 2005 VLSI Symposium, pp. 96-97.

Ahn, S. J; et al "Highly Manufacturable High Density Phase Change Memory of 64MB and Beyond" IEEE International Electron Devices Meeting, 2004. IEDM 2004 Technical Digest, Dec. 2004, pp. 907-910.

Hwang, Y. N; et al "Writing Current Reduction for High-Density Phase-Change RAM" IEEE International Electron Devices Meeting, 2003. IEDM 2003 Technical Digest, Dec. 2003, 37.1.1-37.1.4.

Lee, S. H; et al "Full Integration and Cell Characteristics for 64MB Nonvolatile PRAM" Proceedings of the 2004 VLSI Symposium, pp. 20-21.

Yi, J. H; et al "Novel Cell Structure of PRAM With Thin Metal Layer Inserted GESBTE" IEEE International Electron Devices Meeting, 2003. IEDM 2003 Technical Digest, Dec. 2003, pp. 37.3.1-37.3.4.

Kang, D-H; et al "Reduction of the Threshold Voltage Fluctuation in an Electrical Phase Change Memory Device With a GE1SB2TE4/TIN Cell Structure" Extended Abstracts of the 2004 International Conference on Solid-State Devices and Materials, Tokyo 2004, pp. 644-645.

Horii, H; et al "A Novel Cell Technology Using N-Doped GESBTE Films for Phase Change RAM" 2003 Symposium on VLSI Technology Digest of Technical Papers, pp. 1-2.

Matsuzaki, N; et al "Oxygen-Doped GESBTE Phase-Change Memory Cells Featuring 1.5 V/100-UA Standard 0.13-um CMOS Operations" IEEE International Electron Devices Meeting, 2005. IEDM Technical Digest, Dec. 2005, pp. 738-741.

* cited by examiner

VERTICAL PHASE CHANGE MEMORY CELL AND METHODS FOR MANUFACTURING THEREOF

TECHNICAL FIELD

The present invention relates to non-volatile-memory cells wherein the memory cell is programmed by changing the electrical resistance of a material upon provision of thermal energy. In particular the present invention relates to phase-change memories (PCM). In particular the present invention relates to vertical PCM memory cells.

BACKGROUND

Information can be retained in non-volatile memories employing various physical mechanisms such as storage of charge in conductive or dielectric layer in so-called flash memories, re-arrangement of charge in a crystal in so-called FeRAM memories. One type of non-volatile memories is phase-change memories (PCM) also known as phase-change RAM (PRAM). Here information is stored in a memory cell by changing the physical state (amorphous/crystalline) or crystal phase of a phase change material and hence its resistivity. When used in a memory cell, the phase of the phase change material is typically changed by locally heating the material by means of a small pulse of electrical power. Typically a PCM cell comprises two contacts for contacting a layer of a phase change material. When sufficient current is flowing from one contact to another contact through this phase change material layer, this layer will be locally heated resulting in a local change of the solid state thereof. The PCM cell is said to be programmed. Depending on the solid state obtained, e.g. amorphous or crystalline, a bit is either written or erased.

Several configurations of PCM cells can be distinguished in the prior art, depending on the relative position of the phase change layer and the contacts. In a horizontal PCM cell the current flows in an essential horizontal direction through the phase change material, i.e. substantially parallel to the substrate upon which the PCM cell is formed. The footprint of such a horizontal PCM cell is at least the area of the spaced apart contacts and the area of the phase change material in-between these contacts. To allow aggressive scaling and hence reduction of the footprint of an individual memory cell, PCM cells can be configured in a vertical way. State-of-the-art vertical PCM cells consist of a layer of phase change material sandwiched between a top contact, also known as top electrode, and a bottom contact, also known as bottom electrode. The bottom contact is often labeled heater. Such vertical PCM cells are disclosed by A. Pirovano et al. in "Low-Field Amorphous State Resistance and Threshold voltage Drift in Chalcogenide Material", IEEE Trans. Elect. Dev. Vol. 51 no. 5 May 2004 p. 714 and by S. Lai and T. Lowrey in "OUM—A 180 nm Nonvolatile Memory Cell Element Technology for Stand Alone and Embedded Applications", proceedings of IEDM 2001, p 36.5.1-36.5.4. The footprint of a vertical PCM cell and hence the density of the corresponding memory array, is at least the area of the interface between the bottom electrode and the phase change material. This interface region is of the order of $F^2$, whereby F is the minimal dimension available in a given semiconductor manufacturing process. Typically the area of the interface region between the bottom electrode and the phase change layer is smaller than the area of the interface region between the top electrode and phase change layer. For a given current, the current density will consequently be the largest at the bottom electrode/phase change material interface. This location is labeled the melting spot (11) or hot spot as in this region the phase change material will first melt due to the Joule heating and the change in crystallographic structure of the phase change material will start. FIG. 1 shows a schematic cross-sectional view and an electrical equivalent scheme of a typical vertical PCM memory cell formed on a substrate (not shown). The vertical PCM memory cell (1) comprises a select transistor (3) and a PCM element (2) stacked on top of it. The select transistor in this example is a vertical p-n-p bipolar transistor. The n-type base (9) of the bipolar transistor (3) is connected to the word line (WL) of a memory matrix of which the memory cell is an element, while the $p^+$ emitter (10) is connected to the bottom electrode (5). The $p^+$ collector (8) is grounded. The bottom electrode (5) is formed of a conductive material, such as a metal, embedded in a dielectric layer (4), also known as Inter Layer Dielectric (ILD). This dielectric layer (4) isolates the phase change material (6) from the select transistor (3). Overlying the bottom electrode (5) is a layer of phase change material (6). On top of the phase change material a top electrode (7) is formed which is connected to the bit line (BL) of the corresponding memory matrix. As can be seen in FIG. 1 the interface between this top electrode (7) and the phase change material (6) can be substantially larger than the interface between the bottom electrode (5) and the phase change material (6). The amount (11: within dotted line) of the phase change material which will be affected by the Joule heating and hence the programmable volume (11) is determined by the area of the bottom interface. The area of this bottom interface corresponds to the cross-sectional area of the bottom electrode (5) perpendicular to the current path (arrow) and hence is determined by the layout of the bottom electrode.

One drawback of the prior art vertical PCM memory cells is the high writing current, being typically of the order of 1 to 10 mA. Apart from power consumption, such high writing current impedes the formation of high density memory cells as bipolar transistors need to be used as select transistor capable of providing such high writing currents instead of MOSFET transistors which are more easily to integrate and to scale. To lower this writing current, the heat dissipation from the melting spot (11) should be limited. Several solutions are known in the art.

One can lower the heat dissipation by choosing a material for the bottom electrode which has a lower thermal conductivity. Table 1 below lists materials used to manufacture vertical PCM cells. From this table one would select TiN to form the bottom electrode (5) as its thermal conductivity is less than the thermal conductivity of TaN or TiAlN. Depending on the material choice for the bottom electrode the writing current can be significantly decreased.

Also, alternative configurations have been proposed to limit the area of the bottom interface and to confine the current, inter alia in U.S. Pat. No. 5,406,509, by C. W. Jeong et al. in "Switching Current Scaling and Reliability Evaluation in PRAM", proceedings of the Non-Volatile Semiconductor Memory Workshop, 2004, 29-29, and by S. L. Cho et al. in "Highly Scalable On-axis Confined Cell Structure for High Density PRAM beyond 256 MB" in the proceedings of the 2005 VLSI symposium p 96-97. FIG. 2 shows an example of such confined vertical PCM memory cell. On top of the bottom electrode (5) a dielectric layer is deposited (12). In this dielectric layer (12) an opening (13) is formed to expose the underlying bottom electrode (5). A layer of phase change material (6) is formed overlying this opening (13). Typically $SiO_2$ is used as dielectric material as it provides a confinement of the electrical current and thermal energy to the volume defined within the opening (13). In order to fill the opening

(13) with the phase change material, a sequence of in-situ deposition and etch steps is used to deposit the phase change material (6) in the opening (13). In this deposition/etch sequence, each deposited layer is partially etched back using an anisotropic etch to accommodate for the non-conformal character of the deposition process and to improve the filling of the opening (13). Typically a thick dielectric layer (12) of 100 nm of $SiO_2$ is deposited over the bottom electrode (5) in which an opening (13) having a diameter of about 50 nm is patterned. Phase change material 6) is deposited at least in this opening (13). This configuration allows decreasing the writing current by a factor of 2.

Although the confined vertical PCM memory cell concept helps reducing the writing current, several problems remain. A first problem in such a confined configuration is that the dimensions of the opening (13) can not be well controlled as the aspect ratio, i.e. the ratio height/diameter, is typically >1. This lack of dimension control will result in a statistical spread of the dimensions of the melting spot. Especially a wide range of contact resistance distribution inevitably leads to a wide spread of the writing current as is shown by S. J. Ahn et al. in "Highly manufacturable high density phase change memory of 64 Mb and beyond" in the proceedings of IEDM 2004 p 907-910 and by Y. N. Hwang et al. in "Writing current reduction for high-density phase-change RAM" in the proceedings of IEDM 2003 p 37.1.1-37.1.4. A second problem is that the etch-back step in the sequence of deposition/etch/deposition technique for conformal deposition of the phase change material in the opening (13) is likely to induce damages in the active region (11), i.e. the melting spot, of this phase change material, resulting in bad characteristics as is shown by S. J. Ahn et al. in "Highly manufacturable high density phase change memory of 64 Mb and beyond" in the proceedings of IEDM 2004 p 907-910 and by S. H. Lee et al. in "Full integration and cell characteristics for 64 Mb non-volatile PRAM" in the proceedings of 2004 VLSI symposium p. 20-21. A third problem is that in this confined configuration the active region (11) is in direct contact with the bottom electrode (5), allowing heat dissipation through this bottom electrode. Consequently less heat will be available for melting of the phase change material. A fourth problem is that this direct contact of the active region (11) with the bottom electrode (5) might result in a limited endurance of PCM memory cells. After typically less than a billion cycles of amorphization and re-crystallization, the phase change material remains in a given phase, either crystalline or amorphous, and the cell can no longer be programmed.

Hence there is a need for a vertical PCM memory cell which overcomes the problems of the prior art vertical PCM memory cells, in particular the problems mentioned in this background section.

SUMMARY

The present invention discloses in a first embodiment a phase-change memory element (2) comprising a stack of a bottom electrode (5), a volume (14 6-16) of phase-change material and a top electrode (7), characterized in that the phase-change material volume (14 6-16) is divided in two sections (14 6-16) by a layer (12) of electrically insulating material comprising at least one opening (13) for providing ohmic contact between the two sections (14 6-16) of phase-change materials.

The present invention further discloses in this first embodiment a method for manufacturing the phase-change memory element (2), comprising forming a bottom electrode (5) on a substrate, forming a first layer (14) of phase-change material over the bottom electrode (5), forming a first layer (12) of dielectric material over the first phase-change material layer (14), forming an opening (13) in the first dielectric layer (12) to expose the underlying first phase-change material layer (14), forming a second layer (6) of phase-change material overlying the first dielectric layer (12) and contacting the underlying first phase-change material layer (14) in the opening (13), and forming a top electrode (7).

The present invention discloses in a second embodiment a phase-change memory element (2) comprising a stack of a bottom electrode (5), a volume (14 6-16) of phase-change material and a top electrode (7), the phase-change material volume (14 6-16) being divided in two sections (14 6-16) by a layer (12) of electrically insulating material comprising at least one opening (13) for providing ohmic contact between the two sections (14 6-16) of phase-change materials and having within this opening (13) a plug (15) of electrically insulating material such that the ohmic contact is only at the periphery of the opening (13).

The present invention further discloses in this second embodiment a method for manufacturing the phase-change memory element (2), comprising forming a bottom electrode (5) on a substrate, forming a first layer (14) of phase-change material over the bottom electrode (5), forming a first layer (12) of dielectric material over the first phase-change material layer (14), forming an opening (13) in the first dielectric layer (12) to expose the underlying first phase-change material layer (14), forming a second layer (6) of phase-change material overlying the first dielectric layer (12) and only partially filling the opening and contacting the underlying first phase-change material layer (14) in the opening (13), forming a second layer (15) of dielectric material overlying the second phase-change material layer (6), planarizing or patterning the second dielectric layer (15) down to the second phase-change material layer (6), forming a third layer (16) of phase-change material overlying and contacting the second phase-change material layer and forming a top electrode (7).

The present invention discloses in a third_second embodiment a phase-change memory element (2) comprising a stack of a bottom electrode (5), a volume (14 6-16) of phase-change material and a top electrode (7), the phase-change material volume (14 6-16) being divided in two sections (14 6-16) by a layer (12) of electrically insulating material comprising at least one opening (13) for providing ohmic contact between the two sections (14 6-16) of phase-change materials wherein the section (14) of phase-change material in contact with the bottom electrode (5) comprises a cavity self-aligned to the opening (13). The present invention further discloses in this third_second embodiment the phase-change memory element (2) having within this opening (13) a plug (15) of electrically insulating material such that the ohmic contact is only at the periphery of the opening (13).

The present invention further discloses in this third embodiment a method for manufacturing the phase-change memory element (2), comprising forming a bottom electrode (5) on a substrate, forming a first layer (14) of phase-change material over the bottom electrode (5), forming a first layer (12) of dielectric material over the first phase-change material layer (14), forming an opening (13) in the first dielectric layer (12) to expose the underlying first phase-change material layer (14), etching a cavity in the first phase-change material layer (14) self-aligned to the opening (13), forming a second layer (6) of phase-change material overlying the first dielectric layer (12) and contacting the underlying first phase-change material layer (14) in the cavity, and forming a top electrode (7).

The present invention further discloses in this third embodiment a method for manufacturing the phase-change memory element (2), comprising forming a bottom electrode (5) on a substrate, forming a first layer (14) of phase-change material over the bottom electrode (5), forming a first layer (12) of dielectric material over the first phase-change material layer (14), forming an opening (13) in the first dielectric layer (12) to expose the underlying first phase-change material layer (14), etching a cavity in the first phase-change material layer (14) self-aligned to the opening (13), forming a second layer (6) of phase-change material overlying the first dielectric layer (12) and only partially filling the opening and contacting the underlying first phase-change material layer (14) in the cavity, forming a second layer (15) of dielectric material overlying the second phase-change material layer (6), planarizing or patterning the second dielectric layer (15) down to the second phase-change material layer (6), forming a third layer (16) of phase-change material overlying and contacting the second phase-change material layer and forming a top electrode (7).

DRAWINGS

Figure 1A:
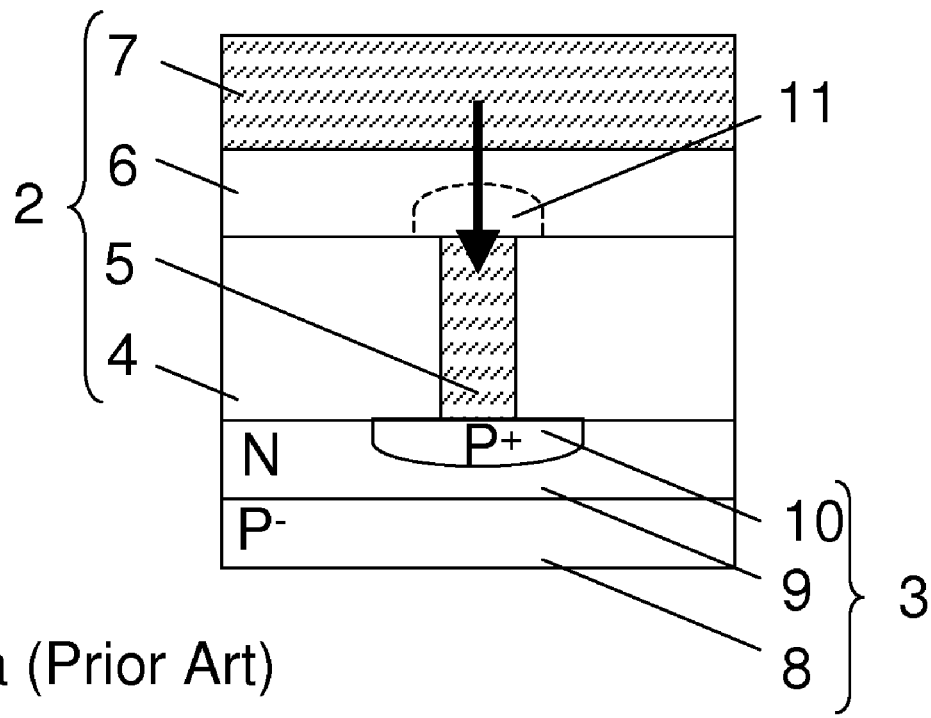
FIG. 1 shows a schematic cross-section of a prior art vertical PCM memory cell (a) and the corresponding electrical equivalent scheme (b).
Figure 1B:
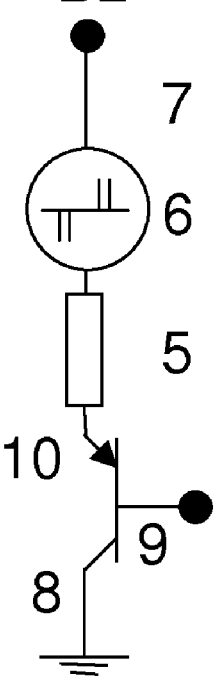
Figure 2:
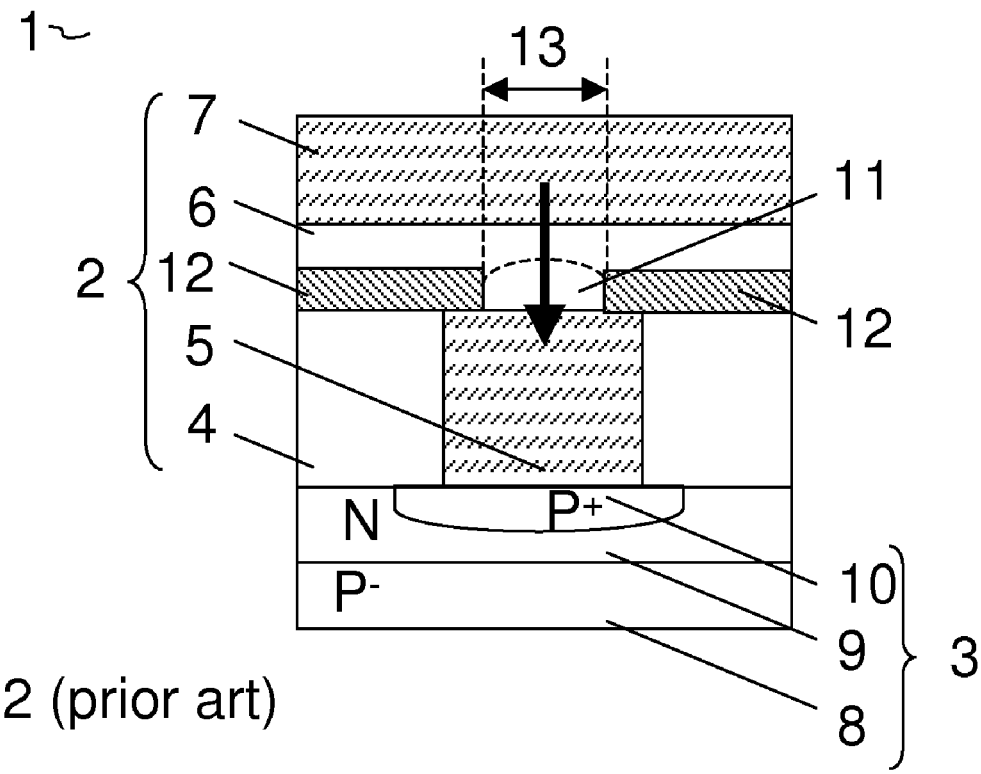
FIG. 2 shows a schematic cross-section of a prior art vertical PCM memory cell.
Figure 3A:
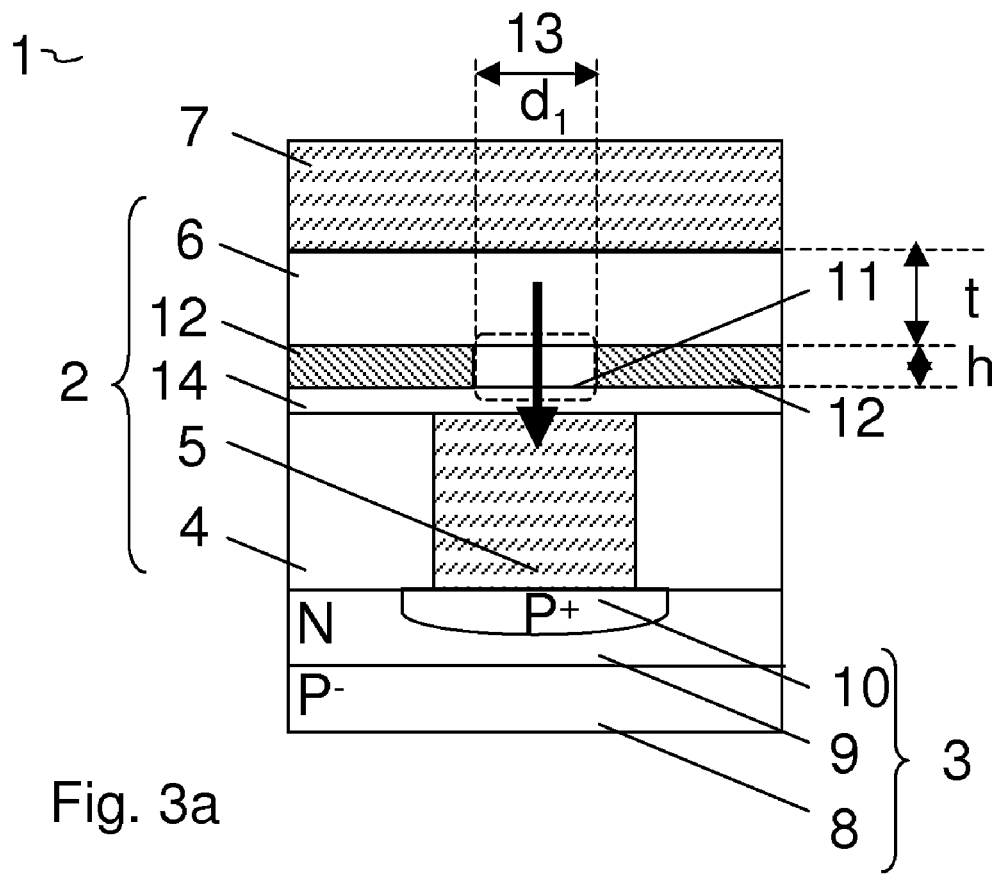
Figure 3B:
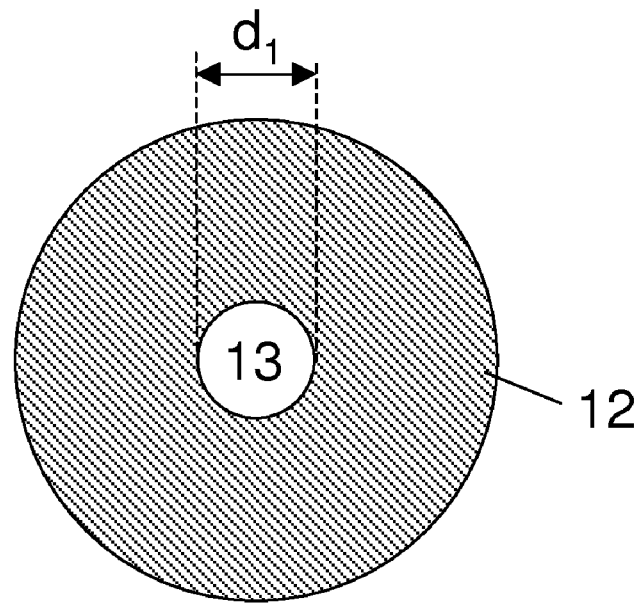
Figure 4A:
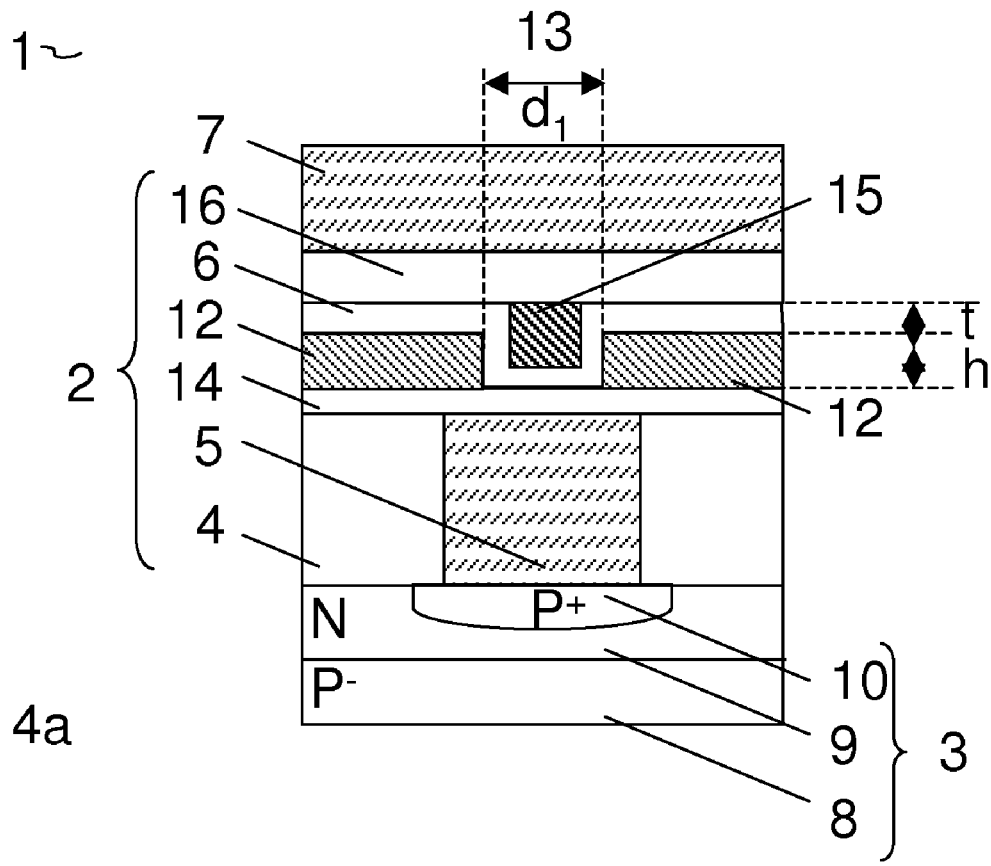
Figure 4B:
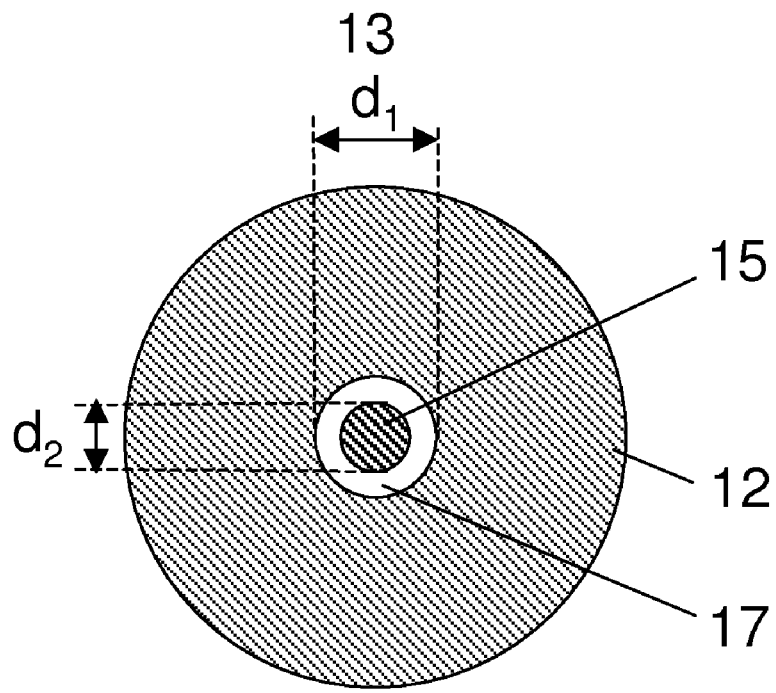
Figure 4C:
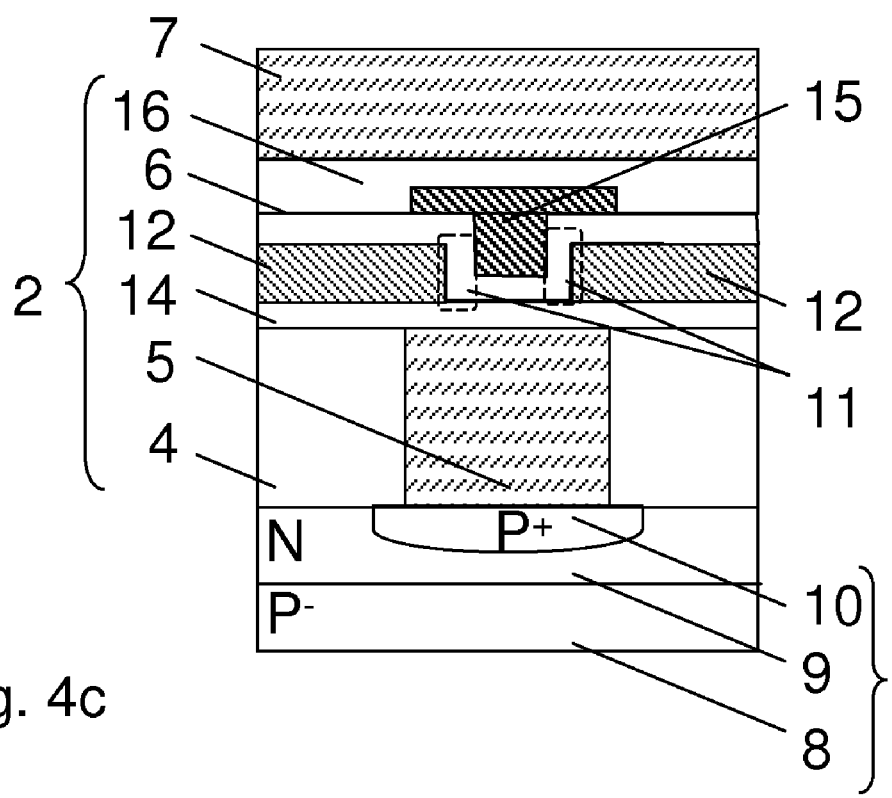
Figure 4D:
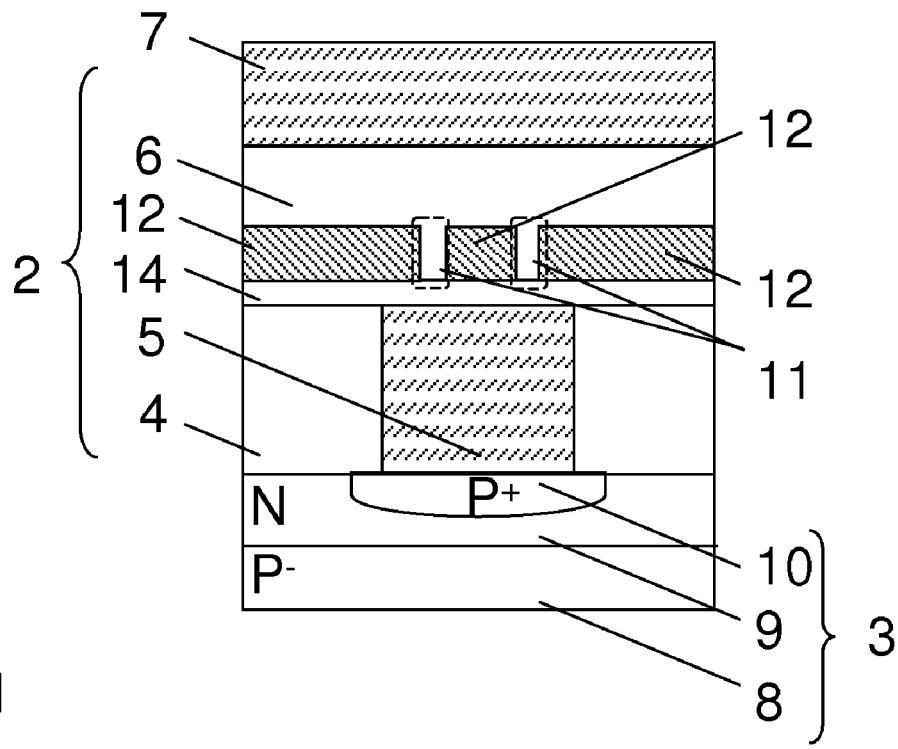
Figure 4E:
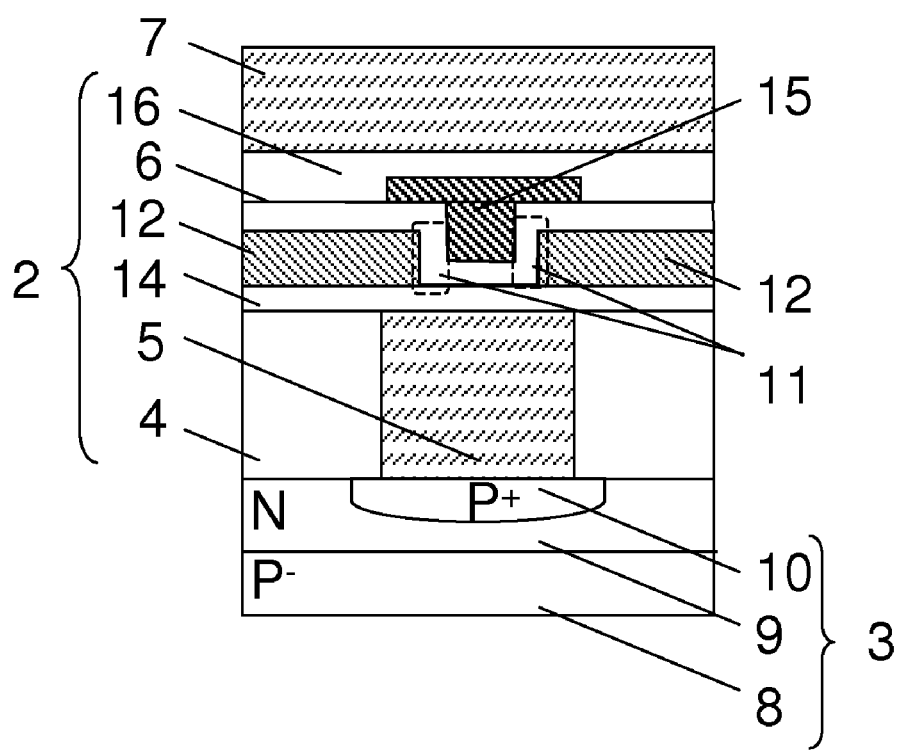
Figure 5A:
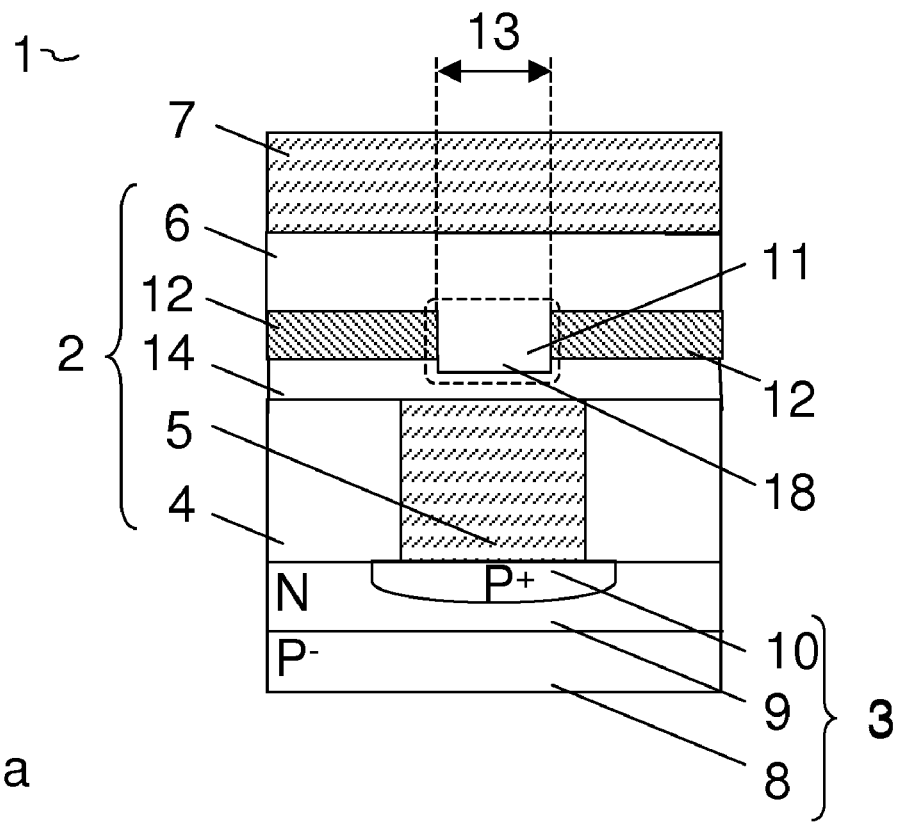
Figure 5B:
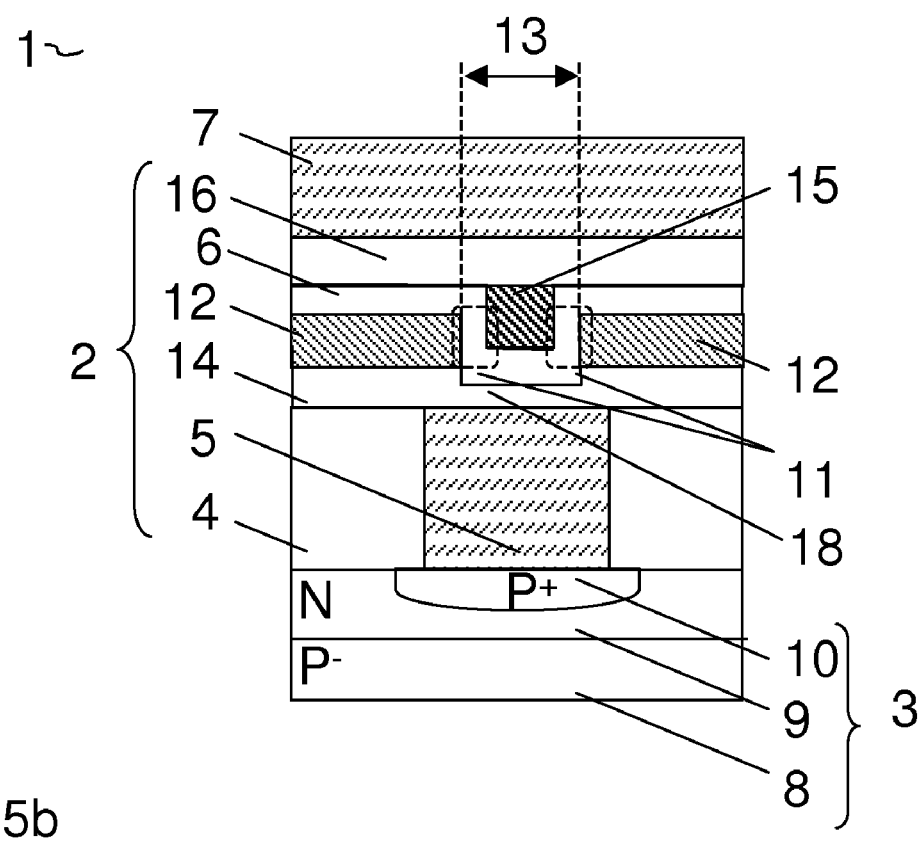
Figure 6A:
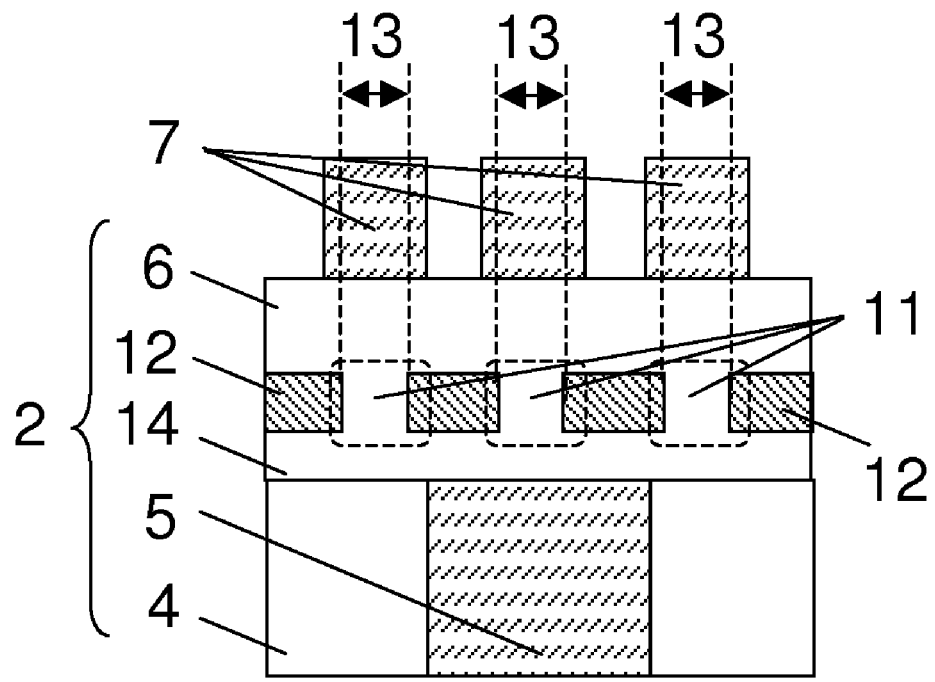
Figure 6B:
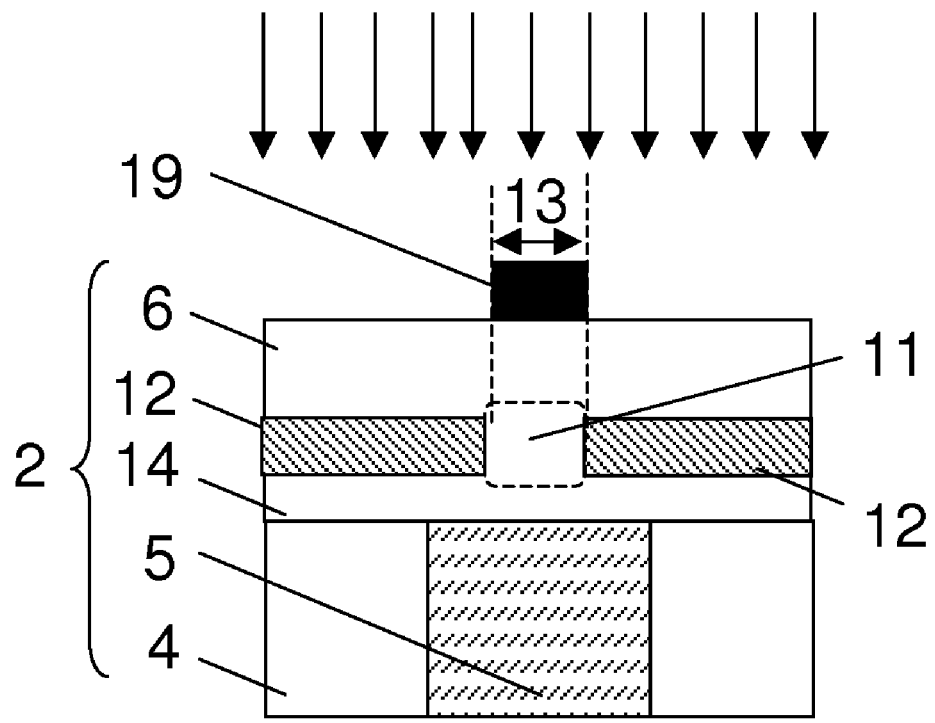

FIG. 3a-b shows a schematic cross-sectional view (a) and a schematic top view (b) of a vertical PCM memory cell according to a first embodiment FIG. 4a-e shows a schematic cross-sectional view (a), the corresponding schematic top view (b) and schematic cross-sectional views (c, d, e) of vertical PCM memory cells according to a second embodiment FIG. 5a-b shows a schematic cross-sectional view of vertical PCM memory cells (a), (b) according to a third embodiment FIG. 6a-b show alternative methods for forming a vertical PCM memory element according to a fourth embodiment In the different figures, the same reference signs refer to the same or analogous elements.

DETAILED DESCRIPTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice the invention. In the present invention the process steps used such as deposition, patterning, implantation, oxidation, are known to any person of ordinary skill in the manufacturing of semiconductor devices. This person will also realize that the step of patterning a layer might comprises forming a pattern in a photosensitive material overlying this layer using a photolithographic process, using the patterned photosensitive material as mask to remove the exposed parts of the underlying layer, e.g. by a wet or a dry etch, and removing the patterned photosensitive material. The process steps used to manufacture a vertical PCM memory element according to any of the embodiments are known in the art. For example process steps disclosed in U.S. Pat. No. 5,406,509, hereby incorporated by reference, to form various regions of dielectric, semi-conductive, conductive and phase change materials can be employed. With layer is also meant stack of layers.

In a first embodiment, illustrated by FIGS. 3a-b, a vertical PCM memory element (2) is disclosed according to the present invention.

FIG. 3a shows a cross-sectional view of a vertical PCM memory cell (1) according to the first embodiment. The PCM element (2) of such PCM memory cell comprises a stack of a bottom electrode (5), a first layer (14) of a conductive material, preferably of a phase change material, in direct contact with the bottom electrode (5), a layer (12) of dielectric material overlying the first layer (14), a second layer (6) of a conductive material, preferably of a phase change material, overlying the dielectric layer (12), and a top electrode (7) in direct contact with the second layer (6). The second layer (6) is in direct contact with the first layer (14) through an opening (13) formed in the dielectric layer (12) insulating the first (14) and the second layer (6). The PCM memory cell (1) shown in FIG. 3a can further comprise a select transistor (3), such as a bipolar transistor, a thin-film transistor, a MOSFET.

A person skilled in the art will realize that phase change material must be present at least within the opening (13) to form an active region (11), but that the material (14, 6) present between the active region (11) and respectively the bottom contact (5) and the top contact (7) is selected to provide appropriate electrical and thermal conductivity as will be discussed below. The first (14) and the second (6) layer can be formed from the same or different conductive materials. The first (14) and the second (6) layer can be formed from the same or different phase change materials. Preferably the material of the first (14) and second layer (6) is a phase change material. More preferably the same or similar phase change material is used to form the first (14) and the second (6) layer. Because of the better matching of the material properties and composition of both layers (14, 6), the reliability of the PCM memory cell (1) is improved, as inter alia, essentially no interface will be present between both layers (14) 66), a better cohesion between both layers (14) 6) can be obtained and segregation effects from one layer to another can be reduced. For the purpose of teaching the invention a phase change material is used to from the first layer (14) and the second layer (6).

The material of the dielectric layer (12) is selected in first instance to provide sufficient electrical insulation between the first (14) and the second (6) layer. Furthermore this dielectric layer (12) can assist in preventing lateral spread of the heat generated in or near the opening (13) when the vertical PCM (1) is in use.

A vertical PCM memory cell according to the present invention has the advantage that the active region (11) is no longer in direct contact with the bottom electrode (5), thereby improving the endurance of the cell. As the material of the first layer (14), separating the melting spot (11: within dotted area) from the bottom electrode (5), is selected to have at least a thermal conductivity which is less than the thermal conductivity of the material of the bottom electrode (5), less thermal energy will leak away from the melting spot (11) towards the bottom electrode (5). In particular if a phase change material is used to form the first layer (14), this phase change material has a thermal conductivity that is preferably orders of magnitude lower than that of the bottom electrode as shown in table 1 below.

A PCM element (2) of a PCM memory cell (1) according to the first embodiment comprises a stack of a bottom electrode (5), a volume (6, 14) of phase change material and a top electrode (7), characterized in that the volume (6, 14) is divided in two sections (6, 14) by a layer (12) of electrical insulating material, preferably a dielectric, comprising at least one opening (13) for providing ohmic contact between the two sections (6, 14). The dielectric layer (12) is thus interposed between two sections of phase change material (6, 14) which are only in ohmic contact at the one or more openings (13) formed in this dielectric layer (12).

A PCM element (2) of a PCM memory cell (1) according to the first embodiment comprises a stack of a bottom electrode (5), a first layer (14) in ohmic contact with the bottom electrode, a dielectric overlying the first conductive layer (14) and having an opening (13) to expose the first layer (14), the opening (13) being at least partially filled with a phase change material (11) in ohmic contact with the first conductive layer (14), a second layer (6) of a conductive material overlying the dielectric layer (12) and in ohmic contact with the phase change material (11) and a top contact (7) in ohmic contact with the second conductive layer (6). Preferably the first (14) and second (6) conductive layers are formed in a phase change material in which case the phase change material in the opening (13) is provided by the material of either the first (14) or by the second conductive layer (6). More preferably the first (14) and second (6) conductive layers are formed in the same phase change material.

TABLE 1 thermal and electrical conductivity of some materials to be used in PCM cells

| Element | Material | Electrical resistivity (mohm · cm) | Thermal conductivity ($10^{-6}$ W/μm · K) |
|---|---|---|---|
| Top electrode | TaN | 0.260 | ~50 |
| Bottom electrode (5), (7) | TiN | 0.05 | ~10 |
|  | TiAlN | ~1 | ~40 |
| phase change material (6), (14), (16) | GST225 | ~1 | 0.5-1.5 |
|  | AIST | 1 | 1.2 |
| dielectric (4), (12), (15) | SiC | ~$10^{11}$ | 120 |
|  | SiO2 | ~$10^{23}$ | 1.5 |

Such a PCM memory element can be formed as follows. First a bottom electrode (5) is formed, embedded in a dielectric layer (4) and/or patterned on top of a dielectric layer. This bottom electrode can be formed by sputtering or Physical Vapor deposition (PVD) a layer of conductive material and patterning this layer. The bottom electrode (5) can be formed from a conductive material, preferably a metal, a metal-oxide or metal-nitride. On top of this bottom electrode (5) a first layer (14) of a phase change material is formed. This first layer can be formed by sputtering or Physical Vapor deposition (PVD) phase change material and patterning this phase change material. On top of this first layer (14) a layer (12) of a dielectric material is formed having a height (h). This dielectric layer can be formed by Chemical Vapor Deposition (CVD). This dielectric layer (12) is patterned to form an opening (13) having a diameter ($d_1$) to expose the first layer (14) underlying the dielectric layer (12) as shown in the schematic top view of FIG. 3b. Overlying this dielectric layer (12) and at least partially filling this opening (13), a second layer (6) of phase change material is formed. This second layer can be formed by sputtering or Physical Vapor deposition (PVD) phase change material and pattering this phase change material. A top electrode (7) is formed by on top of the second layer (6). This top electrode can be formed by sputtering or Physical Vapor deposition (PVD) a layer of conductive material and patterning this layer. The top electrode (5) is formed from a conductive material, preferably a metal, a metal-oxide or metal-nitride. By inserting an additional layer (6), preferably of a phase change material, between the bottom electrode (5) and the melting spot (11) as shown in FIG. 3a, the active region (11) is now located between two layers (14 6) of a phase change material. The melting spot (11) is offset from the bottom electrode (5). The phase change material within the opening (13) is surrounded by insulating material (12) providing confinement of the electrical current (arrow) exchanged between the top electrode (7) and the bottom electrode (5) and confinement of the thermal energy.

The material and/or the thickness of the first layer (14) are selected to provide appropriate thermal insulation during the respective steps of locally melting the phase change material in or near the opening (13) to form an amorphous region in this phase change material and of recrystallisation of this amorphous region. Temperatures for melting the phase change material will be higher than the temperatures at which recrystallisation will occur.

When recrystallisizing the amorphous region, the combination of high current and higher resistivity of this amorphous region might result in amount of heat generated which is more than the needed for the recrystallisation of the phase change material. Instead of recrystallizing the material unwanted melting might occur. The problem of over-programming failures and can provide a quenching support. J. H. Yi et al is discussed in "Novel cell structure of PRAM with thin metal layer inserted GeSbTe" the proceedings of IEDM 2003 p 37.3.1-37.3.4. As disclosed in preceding paragraphs the material of the second layer (6) is selected to have low thermal conductivity to reduce the flow of the heat generated in or near the opening (13) towards the bottom electrode (5) For a given material, the thickness of the first layer (14) is selected to allow drainage of this excess heat towards the bottom contact (5) which is then used as a heat sink. This requirement thus sets a lower limit to the thermal conductance of the first layer (14) and hence an upper limit to the thickness of this first layer (14).).

When locally melting the crystalline phase change material in or near the opening (13) sufficient heat must be present to obtain the desired, higher, temperatures. For a given material, the thickness of the first layer (14) is then selected to reduce leakage of heat generated near the opening (13) towards the bottom contact (5). This requirement thus sets an upper limit to the thermal conductance of the first layer (14) and hence a lower limit to the thickness of this first layer (14). The inserted phase change material layer (14) should be thick enough to keep the heated area (11) far enough from the bottom electrode (5) and to provide sufficient thermal insulation there from. On the other hand, this first layer (14) should not be too thick either as the series resistance of the first layer (14) of phase change material should be limited allowing a low voltage operation of the PCM memory element (2).

Also the material and/or thickness of the second layer (6), separating the dielectric layer (12) from the top electrode (7), must be carefully selected. On the one hand this second layer (6) should be thick enough for providing sufficient thermal insulation between the top electrode (7) and the melting spot (11). On the other hand this second layer (6) should be thin enough the provide a low resistive path between this top electrode (5) and the melting spot (11) to allow low-voltage operation of the PCM memory element (2). A good trade-off could be a thickness in the range of 25 to 150 nm, preferably in the order of 50-100 nm, each of the layers (6, 14).

Thanks to the better thermal insulation of the active region (11), the thickness (h) of the dielectric layer (12) sandwiched between the first (14) and the second (6) conductive layers, can be reduced compared to the prior art. The thickness (h) of this dielectric layer (12) is preferably less than 15 nm, more preferably less than 10 nm. In the first embodiment the dielectric layer (12) is in first instance used to define the diameter ($d_1$) of the melting spot (11) and to provide thermal insulation in lateral direction. The diameter ($d_1$) of the melting spot (11) is defined by the opening (13) formed in this dielectric layer (12) as shown in FIG. 3b. The electrical current (arrow) flowing between the bottom electrode (5) and the top electrode (7) is confined by this opening (13) resulting in a locally increased current density and hence locally increased Joule heating.

As this dielectric layer (12) can be made as thin as possible, the aspect ratio of the opening (13) formed therein can be reduced to about 0.2 or less. The complicated prior art process sequence of deposition/etch/deposition steps to form the second layer (6) in the opening (13) and on top of the dielectric layer (12) is no longer required. Hence the phase change material of the melting spot (11) does not suffer any longer from etch-induced damages. Moreover, thanks to the reduced height (h) of the opening (13), the phase change material filling this opening (13) can be directly sputtered in this opening to form a conformal layer without the need for etching steps. Thereafter deposition of the top electrode (7) upon the layer (6) of the phase change material is done. This top electrode can be deposited in the same deposition tool without the need for breaking the vacuum environment or can be formed in another deposition tool. Preferably a layer (6) having a thickness in the range 50 to 100 nm, is sputtered into this opening (13).

As the aspect ratio (h/d) of the opening (13) can be substantially reduced, the patterning process of this opening and hence the dimensions of the opening, can be better controlled.

As shown in FIG. 3a the diameter of the bottom electrode (5) is no longer determining the diameter ($d_1$) of the hot spot, allowing a larger freedom in the layout and dimensions of this bottom electrode (5).

The heat generated in the active region (11) will depend on the resistance of this active region (11) and on the current flowing through this active region (11) when operating the device. The amount of current flowing between the top (7) and bottom contact (5) will depend on the voltage applied over the PCM memory element (2) and on the resistance of this current path. The resistance of this current path will depend on the choice of materials and thickness used to form the various elements in this current path, e.g. bottom contact (5), different conductive layers (14, 6), top contact (7).

One can for example increase the resistance of the bottom contact (5) by forming a thin oxide layer on top of the conductive material of this bottom contact. D-H Kan et al discloses in "Reduction of the threshold voltage fluctuation in an electrical phase change memory device with a Ge1Sb2Te4/tiN cell structure", Extended Abstracts of the 2004 International Conference on Solid State Devices and Materials, Tokyo 2004, p. 644-645, hereby incorporated by reference, a superficial oxidation of a TiN bottom electrode. A thin TiON layer is formed on top of the TiN material such that the overall electrical and/or thermal resistance of the bottom electrode is increased.

One can for example increase the resistivity of one or more layers (14, 6) of phase change material present in the current path by incorporation of selected elements in the phase change material. These selected elements can be incorporated e.g. afterwards by ion implantation thereof in the phase change material or in parallel with the deposition of the phase change material. H. Horii et al discloses in "A Novel Cell Technology using N-doped GeSbTe Films for Phase Change RAM", 2003 Symposium on VLSI Technology Digest of Technical Papers, hereby incorporated by reference, the incorporation of nitrogen in GST layers to increase the resistance thereof. They report a reduction of the reset current of a PCM memory cell by a factor up to 1.5. N resulting in reset current of about 600 uA. Matsizaki et al discloses in "Oxygen-doped GSbTe Phase-Change Memory Cells Featuring 1.5-V/100-uA Standard 0.13-um CMOS Operations", IEDM 2005 Technical Digest, hereby incorporated by reference, the incorporation of oxygen in GST layers to increase the resistance thereof. They report a reduced reset current of a PCM memory cell about 100 uA. One can thus increase the electrical resistance of the first (14) and/or the second (6) layer of the phase change material in accordance with the desired amount of current in operation.

In a second embodiment, illustrated by FIGS. 4a-c, the vertical PCM memory element (2) of the first embodiment can be further improved.

FIG. 4a shows a cross-sectional view of a vertical PCM memory cell (1) according to the second embodiment. The PCM element (2) of such PCM memory cell comprises a stack of a bottom electrode (5), a first layer (14), preferably of a phase change material, in ohmic contact with the bottom electrode (5), a first layer (12) of dielectric material overlying the first layer (14) and having an opening (13) therein to expose the first layer (14), a second layer (6) of phase change material overlying the layer (12) of dielectric material and partly filling the opening (13), a second layer (15) of dielectric material at least partly filling the opening (15), a third layer (16) of a phase change material in direct contact with the second dielectric layer (15) and a top electrode (7) in direct contact with the overlying layer (6, 16) of phase change material. The PCM memory cell (1) shown in FIG. 4a can further comprise a select transistor (3), such as a bipolar transistor, a thin-film transistor, a MOSFET, as known in the art.

Such a vertical PCM memory element (2) can be manufactured as follows. First a bottom electrode (5) is formed, embedded in a dielectric layer (4), or patterned on top of a contact to the select transistor. On top of this bottom electrode (5) a first layer (14) of a phase change material is formed which is in direct contact with the bottom electrode. On top of this first layer (14) a layer (12) of a dielectric material is formed having a height (h). In this dielectric layer (12) an opening (13) is patterned having a diameter ($d_1$) to expose the first layer (14) underlying the dielectric layer (12) as shown in the schematic top view of FIG. 4b. Overlying this dielectric layer (12) and partly filling this opening (13), a second layer (6) of phase change material is conformal formed which is in direct contact with the first layer (14). The thickness (t) of this second phase change material layer is therefore selected to be less than the thickness (h) of the dielectric layer (12) such that a trench remains at the location of the opening (13). Phase change material is deposited adjacent the sidewalls of the opening (13) and on the exposed first layer (14) at the bottom of the opening (13). As the middle part of the opening (13) is not filled with phase change material a dimple or recess remains in the upper surface of the memory element (2) at the location of the opening (13). After forming the opening (13) in the dielectric layer (12) and depositing the second layer (6) of phase change material over the dielectric layer (12), a second dielectric layer (15) is formed overlying the second layer (6) of phase change material. The thickness of the second dielectric layer (15) is selected to at least partially fill the recess which remained after depositing the second layer (6). The first layer (14) creates a gap between the perimeter of the first dielectric layer (12) and the second dielectric layer (15) present in the recess. Preferably the thickness of the second dielectric layer (15) is equal to or greater than the thickness (h) of the first dielectric layer (12). This second dielectric layer (15) can be of the same dielectric material as used to form the first dielectric layer (12), e.g. silicon-oxide, silicon-nitride, silicon-carbide, silicon-oxy-nitride. This second dielectric layer (15) is then planarized to expose the underlying second layer (6). Planarisation can be done by e.g. chemical mechanical polishing (CMP) or etching back as is known in the art. A third layer (16) of a phase change material is then deposited overlying the second layer (6) of phase change material. On top of this third layer (16) of phase change material the top electrode (7) is formed. Whereas in the first embodiment the active region (11) is in the shape of a circle having a diameter $d_1$, in the second embodiment the active region (11) has a toroidal shape with an outer diameter ($d_1$) defined by the diameter of the opening (13) and with an inner diameter $d_2$, which is equal to difference ($d_1-2*t$) as shown in FIG. 4b. The width of this annular ring (17) is thus defined by the thickness (t) of the second layer (6). The thickness of the first dielectric layer can be 20 nm or less, preferably about 15 nm. The thickness of the second layer (6) can be 15 nm or less. The thickness of the third layer (16) can be in the range 25 to 150 nm, preferably in the range 50-100 nm. The diameter $d_1$ of the opening (13) can be in the range 50 to 100 nm, preferably in the range 80 to 100 nm.

Instead of planarizing the second dielectric layer to form the dielectric plug (15), the second dielectric layer can be patterned using photolithographic processing and dry etching of the dielectric layer (12). FIG. 4c shows a cross-section of a vertical PCM memory element (2) processed accordingly. A layer of dielectric material is deposited overlying the second layer (14) and at least partially filing the recess present in this second layer at the location of the opening (13). The deposited dielectric material is then patterned to form the second dielectric layer (15). Preferably the second dielectric layer (15) will extend over boundary of the recess as shown in FIG. 4c. The processing can then be continued as discussed in the previous paragraph by depositing the third layer (16). FIG. 4d shows a cross-section of a vertical PCM memory element (2) processed using photolithographic processing and dry etching to form a dielectric plug (15) inside the opening (13) and hence to reduce the cross-section of the active area (11) compared to active area (11) of the memory cell of the first embodiment. Instead of patterning an opening (13) in the first dielectric layer (12) the trench (17) is directly patterned in this dielectric layer (12). As shown in FIG. 4d the second layer (6) is deposited overlying the first dielectric layer (12) and filling the trench (17).

In the first embodiment the area of the active region (11) corresponds to the area of the opening (13) formed in this dielectric layer (12). The second embodiment thus provides a further increase of the current density at this active region (11) by reducing the lateral cross-sectional area of the opening (13) and hence of the active region (11). A plug of dielectric material (15) is formed within this opening (13) such that a closed loop trench is created at the perimeter of the original opening (13). The first (14) and the second (6) layer of phase change material are now in ohmic contact only in a zone at the boundary of the opening (13). This is illustrated in FIG. 4b where a circular shaped plug (15) centered in the opening (13) is present to create an annular shaped contact region (17). A person skilled in the art will realize that other layouts of the opening (13) and of the plug (15) can be realized without departing from the scope of the invention.

More generally a PCM element (2) of a PCM memory cell according to the second embodiment comprises a stack of a bottom electrode (5), a first layer (14) of a phase change material in direct contact with the bottom electrode (5), a layer (12, 15) of dielectric material overlying the first layer (14) and having an annular-shaped opening (13) therein to expose the first layer (14), at least one layer (6, 16) of phase change material filling the annular-shaped opening (17) and overlying the layer (12, 15) of dielectric material, and a top electrode (7) in direct contact with the overlying layer (6, 16) of phase change material.

A PCM element (2) of a PCM memory cell (1) according to the second embodiment comprises a stack of a bottom electrode (5), a volume (14, 6-16) of phase change material and a top electrode (7), characterized in that the volume (14, 6-6) is divided in two sections (14, 6-16) by a layer (12) of dielectric material comprising at least one opening (13) for providing ohmic contact between the two sections (14, 6-16) and that within this opening (13) a plug (15) of dielectric material is present such that the ohmic contact regions is annular shaped. The dielectric layer (12) is thus interposed between two sections of phase change material (14, 6-16) which are only in ohmic contact at the one or more openings (13) formed in this dielectric layer (12) and the area of the ohmic contact region is reduced by a dielectric plug (15).

FIG. 4e illustrates the operation of a vertical PCM memory element (2) according to the second embodiment. The melting spot (11) is now doughnut-shaped and the current is flowing (arrows) between the top electrode (7) and the bottom electrode (5). As the area of the band (11) in FIG. 4a is less than the area of the full circle (11) in FIG. 3a, the writing current of a vertical PCM memory cell according to the second embodiment is less compared to the first embodiment. Moreover the dimensions of the active region (11) can be even better controlled as the opening (13) can be made larger thereby relaxing the requirements of the patterning process while the width ($d_1-d_2$) of the melting zone (11) can be defined by deposition process of the second layer (6) which determines the thickness (t) of this second layer (6).

In a third embodiment, illustrated by FIGS. 5a-b, the vertical PCM memory element (2) of the first and the second embodiments can be further improved. In the first embodiment as illustrated by FIG. 3a and in the second embodiment as illustrated by FIG. 4a, the opening (13) in the first dielectric layer (12) was etched selectively towards the underlying layer (14) of phase change material. Hence the interface (18) between the first layer (14) and second layer (6) of phase change material is located at or near the bottom of the opening (13). The melting spot (11: within dotted area) might hence include this interface layer which can be damaged during the step of creating the opening (13) in the first dielectric layer (12). According to the third embodiment the first layer (14) of phase change material is also etched after etching the opening (13) in the dielectric layer (12). Either the patterning process of the opening (13) is used to extend the opening (13) in the dielectric layer (12) into the first layer (14) or the opening (13) is used as masking layer to etch the underlying first layer (14) in a subsequent etch step. A cavity is thus formed in the phase change material (14) underlying the first dielectric layer (12) which cavity is self-aligned to the opening (13) in this dielectric layer (12). As illustrated by FIGS. 5a and 5b the surface of the first layer (14) is no longer adjacent the melting zone (11: within the dotted area) but is positioned below the interface between the first dielectric layer (14) and the first layer (14) of phase change material. If the etching of the opening is deep enough in the first layer (14) of phase change material the active region (11) does not suffer from etch-induced damages. As shown in FIG. 5b if the underlying first layer (14) is partly removed self-aligned to the opening (13) in the first dielectric (12), the thickness (h) of this dielectric layer (12)

can be further reduced and can be thinner than the second layer (6). In an example this thickness (h) was about 15 nm, while the thickness (t) of the second layer (6) of phase change was about 15 nm, while the opening (13) had a diameter between 80 to 100 nm.

Although the top view of FIGS. 3b and 4b show a circular layout of the first dielectric layer (12) and of the opening (13) therein, the teaching of the description is not limited to this particular layout. Other layouts of the dielectric layer and/or the opening and/or elements of a vertical PCM memory element according to the present invention can as well be used as will be appreciated by a person skilled in the art.

In a fourth embodiment of the invention alternative methods are disclosed to form the patterned dielectric layer (12) sandwiched between two layers of conductive material (14, 6-16) as disclosed in other embodiments of this invention.

In one alternative embodiment first a bottom electrode (5) is formed, On top of this bottom electrode (5) a first layer (14) of a phase change material is formed. On top of this first layer (14) a layer (12) of a dielectric material is formed. This dielectric layer (12) is formed by oxidizing the first layer (14) of phase change material resulting a uniform oxide layer overlying the entire first phase change material layer (14). This dielectric layer (12) is then patterned to form at least one opening (13) to expose the first layer (14) underlying the dielectric layer (12). Overlying this patterned dielectric layer (12) and at least partially filling this at least one opening (13), a second layer (6) of phase change material is formed. A top electrode (7) is formed on top of the second layer (6). If more than one opening is formed in the dielectric layer (12), an array of vertical PCM memory cells (1) is created having the bottom contact (5) in common. Each of the at least one openings (13) formed in the oxidized phase change material (14) corresponds to an active region (11). With each of these active regions (11) an individual top contact is associated. Such an array is illustrated in FIG. 6a showing 3 openings (13) defining the active region (11). The three active regions (11) have a common bottom contact (5) and individual top contacts (7).

In another alternative method the patterned dielectric (12) is formed by introducing elements in the phase change material (14, 6-16), which elements increase the resistance of this phase change material. H. Horii, et al discloses in "A Novel Cell Technology Using N-doped GeSbTe Films for Phase Change RAM", 2003 Symposium on VLSI Technology Digest of Technical Papers, 4-89114-035-6/03, local ion implantation of nitrogen to increase the resistance of GST films. In this paper nitrogen is introduced in the phase change material at the location of the active region to increase its resistivity and hence the Joule effect when in use. In this alternative method nitrogen is introduced outside the location of the active region (11). One can incorporate these resistance-increasing elements, such as nitrogen, at various moments during the manufacturing process. For example after forming the first layer (14) of phase change material nitrogen can be selectively implanted. FIG. 6b illustrates an alternative whereby a monolithic block of phase change material (6, 14) is formed on the bottom electrode (5). Before forming the top electrode (7) nitrogen is selectively implanted (dotted arrows) in the phase change material at the desired depth and outside the active region (11) such that a high resistive region (12) is formed surrounding this active region (11). Masking layer (19) can be a photosensitive layer patterned to protect the active region (11) from being doped during the implantation process. To ensure that, during operation, a substantial part of the current will flow through the active region (11), the resistance of the implanted layer (12) must be higher than the resistance of the active region (11) whether the phase change material of this active region (11) is in amorphous or in crystalline state.

In a preferred embodiment a process flow is disclosed to manufacture a vertical PCM memory cell according to the first embodiment.

A semiconductor substrate is provided which is processed to the level of front-end-of-line (FEOL) processing. Such FEOL substrate comprises a semiconductor wafer, active devices such as transistors formed in or on this semiconductor substrate, a layer of dielectric material overlying active devices and openings formed in this dielectric layer to allow contacting of the semiconductor substrate and/or of active devices. A patterned layer of conductive material can be present overlying this dielectric layer and filling openings to provide contacts between active devices and/or the semiconductor substrate.

On this FEOL substrate a bottom contact (5) is formed by plasma vapor deposition (PVD) of 50 nm of a metal such as TiN, TiAlN or TaN. The deposition is done by DC sputtering of the metal at room temperature in an Applied Materials ENDURA® PVD system. The metal layer is patterned using photolithographic processing and dry etching. The dry etch is performed in a TCP9600® DFM etch chamber of LAM research using chlorine-based chemistry.

A first layer (14) of 50 to 100 nm $Ge_2SB_2Te_5$ is deposited by plasma vapor deposition (PVD) overlying the bottom contact (5). The deposition is done by DC sputtering of the phase change material at room temperature in an Applied Materials ENDURA® PVD system. The phase change material layer is patterned using photolithographic processing and dry etching. The dry etch is performed in TCP9600® DFM etch chamber of LAM research using chlorine-based chemistry.

A layer (12) of 20 nm of dielectric material is formed overlying the patterned phase change material of the first layer (14). This interlevel dielectric layer (ILD) can be $SiO_2$, $Si_3N_4$ or SIC and can be deposited using plasma enhanced chemical vapor deposition (PECVD) or chemical vapor deposition (CVD) at temperatures below 400° C.

In this dielectric layer (12) an opening or pore (13) is patterned using photolithographic processing and dry etching. The dry etch is performed in a 2300 EXELAN® etch chamber of LAM research using fluorine-based chemistry. Through this opening (13) the first phase change material layer (14) is exposed.

A second layer (6) of about 100 nm $Ge_2SB_2Te_5$ is deposited by plasma vapor deposition (PVD) overlying dielectric layer (12) and contacting the first layer (6) at the bottom of the opening (13). The deposition is done by DC sputtering of the phase change material at room temperature in an Applied Materials ENDURA® PVD system. The phase change material layer is patterned using photolithographic processing and dry etching. The dry etch is performed in TCP9600® DFM etch chamber of LAM research using chlorine-based chemistry.

A top contact (7) is formed by plasma vapor deposition (PVD) of 50 nm of a metal such as TiN, TiAlN or TaN overlying the second layer (6) of phase change material. The deposition is done by DC sputtering of the metal at room temperature in an Applied Materials ENDURA® PVD system. The metal layer is patterned using photolithographic processing and dry etching. The dry etch is performed in a TCP9600® DFM etch chamber of LAM research using chlorine-based chemistry.

Finally a passivation layer is formed overlying the top contact (7) by plasma enhanced chemical vapor deposition (PECVD) or chemical vapor deposition (CVD) of nitride or oxynitride at temperatures below 400° C. Bonding pads are formed to contact the top contact (7) through openings formed in this passivation layer.

The present invention is applicable to all phase change materials. Phase change materials have at least two stable solid states and one can switch from one solid state to another by applying the appropriate heating and cooling sequence. Examples of phase change materials are chalcogenides including binary, ternary or quaternary alloys such as mixtures of germanium, antimony and tellurium or mixtures of silver, indium, antimony and tellurium. A distinction can also be made depending on how the recrystallisation of the phase change material takes places: some materials, such as GST 225 show nucleation driven crystallization and are considered slow-growing materials, other materials such as AIST, exhibit a growth driven crystallization and are considered fast-growing materials. GST 225 stands for the alloy $Ge_2Sb_2Te_5$, while AIST stands for the alloy AgInSbTe.

The invention claimed is:

1. A phase-change memory element comprising:
   a bottom electrode,
   a first layer of a conductive material overlying the bottom electrode,
   a patterned layer of an electrically insulating material overlying the first conductive layer,
   phase-change material at least partially filling the volume in-between the pattern of the patterned layer and in ohmic contact with the first conductive layer,
   a second layer of a conductive material overlying the patterned layer and in ohmic contact with the phase-change material, and
   a top electrode,
   wherein the volume in-between the pattern of the patterned layer comprises a plug of electrically insulating material thereby forming a closed loop gap between the plug and the perimeter of the pattern such that the ohmic contact between the phase-change material and the second conductive layer is located near this perimeter.

2. The memory element of claim 1, wherein the first conductive layer comprises a cavity self-aligned to the pattern of the patterned layer.

3. The memory element of claim 1, wherein the conductive material of the first and the second layer is a phase-change material.

4. The memory element of claim 3, wherein the phase-change material of the first layer, the second layer and in the volume in-between the pattern of the patterned layer is the same phase-change material.

5. The memory element of claim 4, wherein the phase-change material is selected from the group chalcogenides including binary, ternary or quaternary alloys such as mixtures of germanium, antimony and tellurium or mixtures of silver, indium, antimony and tellurium.

6. The memory element of claim 3, wherein at least one of the phase-change materials of the first layer, the second layer and in the volume in-between the pattern of the patterned layer comprises a doping element.

7. The memory element of claim 6, wherein the doping element is nitrogen and/or oxygen.

8. The memory element of claim 1, wherein the patterned layer of an electrically insulating material is a layer of a dielectric material comprising at least one opening.

9. The memory element of claim 8, wherein the dielectric material is selected from the group of silicon oxides, silicon nitrides, silicon oxynitrides, silicon carbides.

10. The memory element of claim 1, wherein the plug of electrically insulating material is a plug of a dielectric material.

11. The memory element of claim 1, wherein the phase-change material forms an active region that is a melting spot of the phase change material, and wherein the first layer of the conductive material is configured to separate the active region from the bottom electrode.

12. A method for manufacturing a phase-change memory element, comprising:
    forming a bottom electrode on a substrate,
    forming a first layer of conductive material over the bottom electrode,
    forming a first layer of dielectric material over the first conductive layer,
    forming at least one opening in the first dielectric layer to expose the underlying first conductive layer,
    at least partially filling the at least one opening with phase-change material,
    forming a plug of dielectric material within the partially filled at least one opening such that a closed-loop trench is created,
    forming a second layer of conductive material overlying the first dielectric layer and contacting the phase-change material layer in the at least one opening, and
    forming a top electrode on the second conductive layer.

13. The method of claim 12 further comprising etching a cavity in the first conductive layer self-aligned to the at least one opening.

14. The method of any of claim 12, wherein the conductive material of the first and the second layer is a phase-change material.

15. The method of claim 14, wherein the phase-change material of the first layer, the second layer and in the volume in-between the pattern of the patterned layer is the same phase-change material.

16. The method of claim 15, wherein the phase-change material is selected from the group chalcogenides including binary, ternary or quaternary alloys such as mixtures of germanium, antimony and tellurium or mixtures of silver, indium, antimony and tellurium.

17. The method of claim 14, wherein at least one of the phase-change materials of the first layer, the second layer and in the volume in-between the pattern of the patterned layer comprises a doping element.

18. The method of claim 17, wherein the doping element is nitrogen and/or oxygen.

19. The method of claim 17, wherein the dielectric material is selected from the group of silicon oxides, silicon nitrides, silicon oxynitrides, silicon carbides.

20. A phase-change memory element comprising:
    a bottom electrode,
    a first layer of a conductive material overlying the bottom electrode,
    a patterned layer of an electrically insulating material overlying the first conductive layer,
    phase-change material at least partially filling the volume in-between the pattern of the patterned layer and in ohmic contact with the first conductive layer,
    a second layer of a conductive material overlying the patterned layer and in ohmic contact with the phase-change material, and
    a top electrode,
    wherein the first conductive layer comprises a cavity self-aligned to the pattern of the patterned layer.

* * * * *